(12) United States Patent
Nakayama et al.

(10) Patent No.: US 8,471,140 B2
(45) Date of Patent: Jun. 25, 2013

(54) POROUS SILICA PRECURSOR COMPOSITION AND METHOD FOR PREPARING THE PRECURSOR COMPOSITION, POROUS SILICA FILM AND METHOD FOR PREPARING THE POROUS SILICA FILM, SEMICONDUCTOR ELEMENT, APPARATUS FOR DISPLAYING AN IMAGE, AS WELL AS LIQUID CRYSTAL DISPLAY

(75) Inventors: Takahiro Nakayama, Ibaraki (JP); Tatsuhiro Nozue, Tsukuba (JP); Hirohiko Murakami, Ibaraki (JP)

(73) Assignee: Ulvac, Inc., Kanagawa (JP)

( * ) Notice: Subject to any disclaimer, the term of this patent is extended or adjusted under 35 U.S.C. 154(b) by 645 days.

(21) Appl. No.: 12/670,117

(22) PCT Filed: Aug. 5, 2008

(86) PCT No.: PCT/JP2008/064046
§ 371 (c)(1),
(2), (4) Date: Jan. 21, 2010

(87) PCT Pub. No.: WO2009/022583
PCT Pub. Date: Feb. 19, 2009

(65) Prior Publication Data
US 2010/0220274 A1    Sep. 2, 2010

(30) Foreign Application Priority Data
Aug. 10, 2007    (JP) ................. 2007-209486

(51) Int. Cl.
*H01L 25/00* (2006.01)
*C01B 33/12* (2006.01)
*C09D 1/00* (2006.01)
*G02F 1/1337* (2006.01)

(52) U.S. Cl.
USPC ............ 136/243; 521/91; 521/110; 521/154; 252/182.3; 106/18.12; 106/18.21; 106/18.32

(58) Field of Classification Search
CPC .. H01L 25/00; C01B 33/12; C09D 1/00; G02F 1/1337
USPC ..... 521/91, 110, 154; 252/182.3; 106/18.12, 106/18.21, 18.32; 136/243
See application file for complete search history.

(56) References Cited

FOREIGN PATENT DOCUMENTS

| JP | 2003-115486 A | | 4/2003 |
|---|---|---|---|
| JP | 2005-154723 | * | 6/2005 |
| JP | 2005 154723 A | | 6/2005 |
| JP | 2005-191437 A | | 7/2005 |
| JP | 2006-073889 A | | 3/2006 |
| JP | 2006-073890 A | | 3/2006 |
| JP | 2007-073914 A | | 3/2007 |
| JP | 2007-134420 | * | 5/2007 |
| JP | 2007-134420 A | | 5/2007 |

OTHER PUBLICATIONS

English translation of Derwent Abstract for Hattori et al, JP 2005-154723, Jun. 16, 2005, pp. 1-3.*
Taiwanese Office Action issued on Dec. 11, 2012; pp. 1-6.

* cited by examiner

*Primary Examiner* — Brian P Mruk
(74) *Attorney, Agent, or Firm* — Arent Fox LLP

(57) ABSTRACT

A porous silica precursor composition is herein provided and the precursor composition comprises an organic silane represented by the following chemical formula 1: $R^1_m(R^2{-}O)_{4-m}Si$ (in the formula, $R^1$ and $R^2$ may be the same or different and each represent an alkyl group, and m is an integer ranging from 0 to 3); water; an alcohol; and a quaternary ammonium compound represented by the following chemical formula 2: $R^3N(R^4)_3X$ (in the formula, $R^3$ and $R^4$ may be the same or different and each represent an alkyl group and X represents a halogen atom). The composition is prepared by a method comprising the step of blending the foregoing components. The porous silica precursor composition is coated on a substrate and then fired to thus form a porous silica film. Also disclosed herein include a semiconductor element, an apparatus for displaying an image and a liquid crystal display, each having the foregoing porous silica film.

18 Claims, No Drawings

US 8,471,140 B2

POROUS SILICA PRECURSOR COMPOSITION AND METHOD FOR PREPARING THE PRECURSOR COMPOSITION, POROUS SILICA FILM AND METHOD FOR PREPARING THE POROUS SILICA FILM, SEMICONDUCTOR ELEMENT, APPARATUS FOR DISPLAYING AN IMAGE, AS WELL AS LIQUID CRYSTAL DISPLAY

CROSS-REFERENCED TO RELATED APPLICATION

This application is a National Stage entry of International Application No. PCT/JP2008/064046, Aug. 5, 2008, which claims priority to Japanese Patent Application No. 2007-209486 filed Aug. 10, 2007, the disclosure of the prior applications are incorporated in their entirety by reference.

TECHNICAL FIELD

The present invention relates to a porous silica precursor composition and a method for the preparation of the precursor composition, a porous silica film and a method for the preparation of the porous silica film, a semiconductor element, an apparatus for displaying an image, as well as a liquid crystal display.

BACKGROUND ART

In the field of the LSI production, the miniaturization of elements has been advanced in recent years. Since the distance between the neighboring interconnections or distributing wires has likewise become narrow in proportion to this miniaturization of the elements and accordingly, the capacity between the neighboring interconnections is increased if the dielectric material disposed between these interconnections has a high dielectric constant. As a result, the electric signals transmitted through the interconnections are correspondingly delayed. For this reason, porous silica having a low dielectric constant has been used as such a dielectric material in many cases and, in particular, it has been known that hydrophobic porous silica having hydrophobicity is quite suitable for use as a dielectric material (see, for instance, Patent Document 1 specified below).
Patent Document 1: Gazetted Specification of Japanese Un-Examined Patent Publication No. 2003-115486 (see, for instance, claim 1).

DISCLOSURE OF THE INVENTION

Problems that the Invention is to Solve

Incidentally, with respect to the foregoing hydrophobic porous silica, an acidic catalyst is used for the hydrolyzation of an organic silane in the process for preparing a precursor composition for forming the hydrophobic porous silica and accordingly, the resulting precursor composition is acidic by nature. For this reason, when applying this acidic precursor composition to a substrate to thus form a hydrophobic porous silica layer or film, a problem arises such that it is impossible to use a spin coater which does not have any acid resistance.

Under such circumstances, it is an object of the present invention to solve the problems associated with the conventional techniques and more specifically to provide a neutral porous silica precursor composition free of any acid or alkali serving as a catalyst as well as a method for the production thereof. It is another object of the present invention to provide a neutral porous silica film and a method for the production thereof using the foregoing neutral porous silica precursor composition. It is a further object of the present invention to provide, for instance, a semiconductor element, an apparatus for displaying an image and a liquid crystal display, which are produced using the neutral porous silica film.

Means for the Solution of the Problems

The porous silica precursor composition according to the present invention is characterized in that it comprises an organic silane represented by the following chemical formula 1: $R^1_m(R^2\text{---}O)_{4-m}Si$ (in the formula, $R^1$ and $R^2$ may be the same or different and each represent an alkyl group, and m is an integer ranging from 0 to 3); water; an alcohol; and a quaternary ammonium compound represented by the following chemical formula 2: $R^3N(R^4)_3X$ (in the formula, $R^3$ and $R^4$ may be the same or different and each represent an alkyl group and X represents a halogen atom).

In the porous silica precursor composition according to the present invention, the foregoing organic silane is incorporated into the precursor composition as a source of Si atoms which constitute porous silica; the water component is incorporated into the precursor composition for the hydrolyzation of the organic silane to thus form ---Si---O---Si--- bonds; and the alcohol component is incorporated into the precursor composition for the control of the viscosity of the resulting porous silica precursor composition and for preventing the occurrence of any gelation of the resulting precursor composition. On the other hand, the quaternary ammonium compound plays a role of not only a surfactant, but also a catalyst for the hydrolyzation. The use of these components would surely permit the achievement of the following advantages: The resulting porous silica precursor composition of the present invention is neutral by nature and when the precursor composition is fired, the surfactant is evaporated to thus form a large number of voids or vacant spaces within the fired product and to thereby form a film having a low dielectric constant.

The foregoing alkyl group is preferably one having not more than 7 carbon atoms. This is because if the carbon atom number is higher than 7, the rate of shrinkage of the resulting film increases due to the influence of the polycondensation reaction (i.e., R---O---Si+Si---OH→Si---O---Si+ROH) during firing. This in turn leads to the formation of cracks and/or the resulting film is liable to cause peeling off from the substrate on which the film is formed.

The halogen atom appearing in the foregoing quaternary ammonium compound is preferably chlorine or bromine atoms.

It is preferred in the present invention that the molar ratio of the foregoing organic silane to the water ranges from 1:1 to 1:30, and that the molar ratio of the organic silane to the alcohol ranges from 1:10 to 1:300.

In this connection, if the molar ratio of the foregoing organic silane to the water is less than 1:1 (i.e. the organic silane (1 mole) to the water (less than 1 mole)), the organic silane does not cause hydrolyzation and thus any porous silica cannot be formed, while if the molar ratio of the organic silane to the water is higher than 1:30 (i.e. the organic silane (1 mole) to the water (more than 30 moles)), the hydrolyzation of the organic silane proceeds even to a high level and the precursor composition causes gelation within a short period of time. On the other hand, if the molar ratio of the foregoing organic silane to the alcohol is less than 1:10 (i.e. the organic silane (1 mole) to the alcohol (less than 10 moles)), the resulting precursor composition undergoes gelation within a short period of time, while if the molar ratio of the foregoing organic silane to the alcohol is higher than 1:300 (i.e. the organic silane (1 mole) to the alcohol (more than 300 moles)), the resulting precursor composition has a low viscosity and it is thus difficult to apply the resulting composition onto the surface of a substrate.

The molar ratio of the foregoing organic silane to the quaternary ammonium compound preferably ranges from 1:0.05 to 1:0.40. In this connection, if the molar ratio of the organic silane to the quaternary ammonium compound is less than 1:0.05 (i.e. the organic silane (1 mole) to the quaternary ammonium compound (less than 0.05 moles)), the amount of the quaternary ammonium compound as a surfactant is too small to form micelles with respect to the organic silane, while if the molar ratio of the foregoing organic silane to the quaternary ammonium compound is higher than 1:0.40(i.e. the organic silane (1 mole) to the quaternary ammonium compound (more than 0.40 moles)), the resulting composition cannot form any porous film, but may form a layer when applying to a substrate.

The foregoing porous silica precursor composition preferably comprises a hydrophobic substance. The incorporation of such a hydrophobic substance would permit not only the formation of a film possessing the resistance to moisture-absorption, but also the prevention of the occurrence of any change in the resulting precursor composition with the elapse of time.

The method for the preparation of a porous silica precursor composition according to the present invention is characterized in that it comprises the step of blending an organic silane represented by the following chemical formula 1: $R^1{}_m(R^2-O)_{4-m}Si$ (in the formula, $R^1$ and $R^2$ may be the same or different and each represent an alkyl group, and m is an integer ranging from 0 to 3); water; an alcohol; and a quaternary ammonium compound represented by the following chemical formula 2: $R^3N(R^4)_3X$ (in the formula, $R^3$ and $R^4$ may be the same or different and each represent an alkyl group and X represent a halogen atom).

In the method for the production of a porous silica precursor composition according to the present invention, any acidic or alkaline catalyst is not used at all, and therefore, the resulting porous silica precursor composition becomes neutral.

The foregoing method according to the present invention is further characterized in that, after the completion of the foregoing blending step, the resulting blend is heated to a temperature ranging from 40 to 70° C. If the blend is heated to a temperature falling within the range specified above, the desired hydrolysis would proceed within the blend, while if the heating temperature exceeds 70° C., the hydrolysis would proceed even to an undesirable level, or the polymerization of the components would proceed even to an extreme level, while if the heating temperature is less than 40° C., the rate of the hydrolysis is too low to form a desired film.

It is preferred in the present invention to add the hydrophobic substance in the foregoing blending step.

The porous silica film according to the present invention is characterized in that it is formed using the foregoing porous silica precursor composition.

The porous silica film of the present invention is neutral by nature since it is formed from the foregoing neutral porous silica precursor composition.

The method for forming a porous silica film of the present invention comprises the steps of applying, on the surface of a substrate, the aforementioned porous silica precursor composition, or the porous silica precursor composition prepared according to the foregoing method for the preparation thereof; and subsequently firing the substrate provided thereon with the applied layer of the precursor composition at a temperature ranging from 250 to 500° C.

The film formed according to the porous silica film-forming method of the present invention becomes neutral in its nature, since it is formed using the foregoing neutral porous silica precursor composition. In addition, the porous film can be obtained through a firing step carried at a temperature ranging from 250 to 500° C. and more specifically, the film can be prepared at a temperature not higher than that at which the desired properties of the finally produced device or element may be impaired or damaged.

The aforementioned firing step is preferably carried out in an oxygen gas-containing atmosphere. The use of such an oxygen gas-containing atmosphere in the firing step would permit the formation of a porous silica film excellent in its strength.

In addition, after the foregoing firing step, a treatment for imparting hydrophobicity (hydrophobization treatment) to the product obtained through the firing step is preferably carried out. This hydrophobization treatment is preferably carried out at a temperature ranging from 70 to 500° C. in a hydrophobic substance-containing atmosphere. The use of such a hydrophobization treatment would permit the formation of a film having resistance to moisture-absorption.

The method for forming the porous silica film according to the present invention preferably comprises the steps of applying the aforementioned porous silica precursor composition, or a porous silica precursor composition prepared according to the foregoing method for the preparation thereof onto the surface of a substrate; firing the substrate provided thereon with the applied layer of the precursor composition at a temperature ranging from 350 to 500° C. in an oxygen atom-containing atmosphere; and imparting hydrophobicity to the product obtained after the firing step. Moreover, the method for forming a porous silica film according to the present invention preferably comprises the steps of applying the surface of a substrate with the aforementioned porous silica precursor composition, or the porous silica precursor composition prepared according to the foregoing method for the preparation thereof; and subsequently firing the substrate provided thereon with the applied layer of the precursor composition at a temperature ranging from 350 to 500° C. in an oxygen atom-containing atmosphere.

The semiconductor element according to the present invention is one including a dual damascene structure which comprises a film of an organic silicon atom-containing compound or a porous silicon oxide film as a first dielectric film and an interlayer dielectric film which are formed, in this order, on a substrate provided thereon with interconnection layers, and further comprises a Cu-interconnection film embedded in interconnection grooves, wherein the interlayer dielectric film consists of the foregoing porous silica film or the porous silica film prepared according to either of the foregoing porous silica film-forming methods. In addition, the semiconductor element according to the present invention is one including a dual damascene structure which comprises a film of an organic silicon atom-containing compound or a porous silicon oxide film as a first dielectric film, an interlayer dielectric film and a dielectric film-protecting layer which are formed, in this order, on a substrate provided thereon with interconnection layers, and further comprises a Cu-interconnection film embedded in interconnection grooves, wherein the dielectric film-protecting layer consists of the foregoing porous silica film or the porous silica film prepared according to either of the foregoing porous silica film-forming methods.

The apparatus for displaying an image according to the present invention is one having an optical thin film for a display window, which comprises a transparent conductive film and a film having a low refractive index, laminated together through an intermediate adhesive layer, wherein the film having a low refractive index consists of the foregoing porous silica film or the porous silica film prepared according to the foregoing porous silica film-forming method.

The liquid crystal display according to the present invention is one at least comprising a pair of substrates; a transparent conductive film and a film for controlling the alignment or orientation of liquid crystals, which are formed, in this order, on each of the opposed planes of the paired substrates arranged while facing one another; and a liquid crystal layer obtained by sealing and enclosing liquid crystals between the liquid crystal orientation-controlling films, wherein the liquid crystal orientation-controlling film consists of the foregoing porous silica film or the porous silica film prepared according to the foregoing porous silica film-forming method.

Effects of the Invention

The porous silica precursor composition according to the present invention and the porous silica precursor composition prepared by the method for preparing the same according to the present invention are neutral in its nature and therefore, they can show such an excellent effect that they can be coated on the surface of a substrate and they permit the film-formation on the substrate while making use of an apparatus free of any acid resistance. Moreover, the porous silica film of the present invention and that obtained according to the film-forming method of the present invention can thus show such an excellent effect that these films have a high strength and a low dielectric constant as well as a low refractive index.

In addition, the semiconductor element according to the present invention shows such an effect that the performance thereof is high since it includes, as an interlayer dielectric film, the porous silica film of the present invention, which has a low dielectric constant and a high strength. In addition, the apparatus for displaying an image according to the present invention shows such an effect that it has a high light-extracting efficiency since the apparatus makes use of the porous silica film of the present invention as a low refractive index film. Moreover, the liquid crystal display according to the present invention shows such an effect that the performance thereof is high, since the display is produced while making use of the porous silica according to the present invention, which hardly undergoes deterioration.

BEST MODE FOR CARRYING OUT THE INVENTION

As has been discussed above, in the method for forming a porous silica film according to the present invention, it is preferred to carry out the steps of applying, onto the surface of a substrate, the aforementioned porous silica precursor composition of the present invention, or the porous silica precursor composition prepared by the foregoing method for the preparation thereof according to the present invention; firing the substrate provided thereon with the coated layer of the precursor composition at a temperature ranging from 350 to 500° C. in an oxygen atom-containing atmosphere; and imparting hydrophobicity to the product obtained after the firing step. In addition, in the method for forming a porous silica film, it is preferred that it comprises the steps of applying, onto the surface of a substrate, the aforementioned porous silica precursor composition of the present invention, or the porous silica precursor composition prepared by the foregoing method for the preparation thereof according to the present invention; and firing the substrate provided thereon with the coated layer of the precursor composition at a temperature ranging from 350 to 500° C. in an oxygen atom-containing atmosphere.

The following are the descriptions of the conditions for preparing the foregoing porous silica films, for instance, those for forming each of various kinds of functional films:

The preferred conditions for forming a semiconductor dielectric film are, for instance, as follows: There are used, per one mole of an organic silane, 10 to 20 moles of water, 10 to 20 moles of an alcohol, 0.1 to 0.3 moles of a quaternary ammonium compound, and 0.1 to 0.2 moles of a hydrophobic substance; the firing step is carried out at a temperature ranging from 350 to 500° C. for a time ranging from 30 to 60 minutes in an oxygen atom-containing atmosphere, for instance, in the air or in an oxygen gas atmosphere; and the subsequent hydrophobization treatment is carried out at a temperature ranging from 350 to 500° C. for a time ranging from 30 to 120 minutes.

The preferred conditions for forming a dielectric protective film are, for instance, as follows: There are used, per one mole of an organic silane, 15 to 20 moles of water, 30 to 100 moles of an alcohol, 0.1 to 0.3 moles of a quaternary ammonium compound, and 0.1 to 0.2 moles of a hydrophobic substance; the firing step is carried out at a temperature ranging from 350 to 500° C. for a time ranging from 30 to 60 minutes in an oxygen atom-containing atmosphere, for instance, in the air or in an oxygen gas atmosphere; and the subsequent hydrophobization treatment is carried out at a temperature ranging from 350 to 500° C. for a time ranging from 30 to 120 minutes.

The preferred conditions for forming an optical film are, for instance, as follows: There are used, per one mole of an organic silane, 15 to 20 moles of water, 10 to 50 moles of an alcohol, 0.2 to 0.4 moles of a quaternary ammonium compound, and 0.1 to 0.2 moles of a hydrophobic substance; the firing step is carried out at a temperature ranging from 350 to 500° C. for a time ranging from 30 to 60 minutes in an oxygen atom-containing atmosphere, for instance, in the air or in an oxygen gas atmosphere; and the subsequent hydrophobization treatment is carried out at a temperature ranging from 350 to 500° C. for a time ranging from 30 to 120 minutes.

The porous silica precursor composition according to the present invention will now be described below in detail:

The porous silica precursor composition according to the present invention comprises an organic silane represented by the following chemical formula 1: $R^1_m(R^2-O)_{4-m}Si$ (in the formula, $R^1$ and $R^2$ may be the same or different and each represent an alkyl group, and m is an integer ranging from 0 to 3); water; an alcohol; and a quaternary ammonium compound represented by the following chemical formula 2: $R^3N(R^4)_3X$ (in the formula, $R^3$ and $R^4$ may be the same or different and each represent an alkyl group and X represents a halogen atom).

In the foregoing chemical formula 1 representing the foregoing organic silane, examples of the alkyl groups represented by the substituents $R^1$ and $R^2$ are alkyl groups having not more than 7 carbon atoms (such as methyl, ethyl, propyl, butyl, pentyl, hexyl and heptyl groups), which may be linear or branched (those each carrying a side chain) ones. The alkyl group is more preferably one having 1 to 3 carbon atoms. Specific examples of the organic silane represented by the foregoing chemical formula 1 include tetraethoxy-silane, tetramethoxy-silane, tetrapropoxy-silane, ethyltriethoxy-silane, methyltriethoxy-silane, methyltrimethoxy-silane, dimethyl dimethoxy-silane, dimethyldiethoxy-silane, trimethylmethoxy-silane, and trimethylethoxy-silane.

Regarding the water, the molar ratio of the organic silane to the water preferably ranges from 1:1 to 1:30, more preferably 1:10 to 1:20 and most preferably 1:10.

As the alcohol component, when applying the precursor composition onto the surface of an object to be coated, for instance, that of a substrate, usable herein are those capable of controlling the viscosity of the resulting composition such that the composition can uniformly be applied onto the substrate and capable of providing a composition which does not cause the gelation within a short period of time. Preferably used herein as such alcohols maybe, for instance, lower alcohols such as 2-propanol, methanol and ethanol. In this respect, the molar ratio of the organic silane to the alcohol preferably ranges from 1:10 to 1:300 and may be appropriately set at a level while taking into consideration the desired thickness of the resulting film of the composition. More specifically, if it is intended to obtain a thin film, the molar ratio is set at a higher level up to 1:300, while it is desired for the formation of a thick film, the molar ratio is set at a lower level down to 1:10.

The quaternary ammonium compound used in the present invention is a neutral compound. The use of such a non-acidic quaternary ammonium compound as a catalyst would certainly permit the preparation of a neutral porous silica precursor composition. The alkyl groups represented by the substituents $R^3$ and $R^4$ appearing in the chemical formula 2 may be, for instance, those each having not more than 7 carbon atoms (such as methyl, ethyl, propyl, butyl, pentyl, hexyl and heptyl groups), which may be linear or branched (those each carrying a side chain) ones. Moreover, the halogen atoms appearing in the chemical formula 2 are preferably bromine and chlorine atoms. Specific examples of such quaternary ammonium compounds include tetrapropyl ammonium bromide. These quaternary ammonium compounds may be used in a combination of at least two of them.

This quaternary ammonium compound is a surfactant and therefore, this compound would permit the formation of, for instance, an interlayer dielectric film having a void ratio (porosity) of not less than 50% and a low specific inductive capacity or relative dielectric constant. In this connection, as the void ratio becomes high, an interlayer dielectric film having an extremely low specific inductive capacity can be prepared, but when a void volume is increased even to about 80%, the strength of the resulting film is impaired.

The porous silica precursor composition according to the present invention may further comprise a hydrophobic substance. Examples of such hydrophobic substances usable herein include disilazane compounds each carrying an alkyl group or siloxane compounds each carrying an alkyl group, such as hexamethyl-disilazane, hexaethyl-disilazane, propyl-disilazane, hexamethyl-disiloxane, hexaethyl-disiloxane and tetraethyl-dimethylsiloxane. Among them, particularly preferably used herein are, for instance, disilazane compounds each carrying a methyl group, or siloxane compounds each carrying a methyl group, with siloxane compounds each carrying a methyl group being preferred among others. The siloxane compound is stable in a solution as compared with the disilazane compound and accordingly, the former hardly initiates the polymerization prior to forming the same into a film. In this case, the hydrophobic substance is preferably added to the composition in an amount ranging from 0.05 to 0.3 moles and more preferably 0.1 to 0.2 moles per mole of the organic silane. If the amount of the hydrophobic substance exceeds 0.3 moles, the desired reaction (hydrolysis) does not proceeds, while if it is less than 0.05 moles, the resulting film is insufficient in its hydrophobicity.

Furthermore, the porous silica precursor composition of the present invention may, if desired, include, for instance, an organic solvent for the purpose of the control of the viscosity of the resulting composition, the thickness of the film formed from the same and the rate of evaporation of the medium during the film-forming step. Such an organic solvent may be that having a high boiling point such as n-butyl acetate, xylene and isobutyl alcohol.

The method for preparing a porous silica precursor composition according to the present invention will hereunder be described in more detail.

The porous silica precursor composition according to the present invention can be prepared by blending the foregoing organic silane, water, an alcohol and a quaternary ammonium compound. In this case, the blend or these components are heated to a temperature ranging from 40 to 70° C. after the completion of the blending step, whereby the desired hydrolysis can thus proceed at a predetermined velocity. Moreover, the foregoing hydrophobic substance may be incorporated into the mixture during blending the same.

The porous silica film of the present invention is one obtained by applying the foregoing porous silica precursor composition onto the surface of a substrate (coating step); and then firing the coated precursor composition at a temperature ranging from 250 to 500° C. for 10 minutes to 2 hours using, for instance, a known infrared heating oven (firing step). If the firing step is carried out under the conditions specified above, the resulting film has a sufficiently high strength and the quaternary ammonium compound is evaporated off to thus give a film having a low dielectric constant.

As the coating method, any known ones (such as spin coating technique) can be used and, in this case, any coating applicator which does not have acid resistance can be employed since the precursor composition of the present invention is neutral in its nature. In the spin coating technique, the spin coater is used at a rotational frequency of not less than 500 rpm and preferably not less than 1,000 rpm, although the rotational frequency thereof may vary depending on the viscosity of the composition.

Then the substrate to which the precursor composition is thus applied can subsequently be subjected to a firing step to thus remove the water, alcohol and surfactant present therein through evaporation and to thereby form a porous silica film having a large number of voids or vacant spaces within the same. The firing step is preferably carried out in an oxygen atom-containing atmosphere. The use of such an atmosphere in the firing step would permit the formation of a film having a high strength.

Moreover, the resulting film may be subjected to a hydrophobization treatment at a temperature ranging from 70 to 500° C. in a hydrophobic substance-containing atmosphere, after the completion of the foregoing firing step. Alternatively, this hydrophobization treatment may likewise be carried out by introducing a hydrophobic substance into a chamber for firing at a pressure ranging from $1 \times 10^2$ to $5 \times 10^3$ Pa, for a time ranging from 15 to 120 minutes, according to the bubbling method which makes use of nitrogen gas as a carrier gas. In this case, the siloxane compound and disilazane compound specified above can be used as the hydrophobic substance, and particularly preferably used herein are disilazane compounds. This is because the disilazane compound is liable to cause a reaction when applying a heat as compared with the siloxane compound and accordingly, in the present invention, the disilazane compound is preferentially used in the treatment after the film-forming step. The firing treatment carried out in such a hydrophobic substance-containing atmosphere would certainly permit the impartment of hydrophobicity to the resulting film.

The porous silica film prepared by the method described above is neutral in its nature and the porous silica film has a low dielectric constant and a high strength. For this reason, the film can be used as an interlayer dielectric film for a semiconductor element or a dielectric film-protecting layer for a semiconductor element.

For instance, a silicon oxide film, having a thickness on the order of about 300 to 1,000 nm and serving as a first dielectric film, is formed on the surface of a substrate on which an element such as a transistor has been formed and first interconnections of Cu have likewise been formed, and then an interlayer dielectric film consisting of the porous silica of the present invention and having a thickness of about 500 nm is then formed on the first silicon oxide film. Thereafter, grooves for interconnections are formed on the interlayer dielectric film using a halogenated carbon gas, then a Cu layer for forming interconnections is formed in such a manner that the grooves can be filled up with the Cu layer, the surface of the laminated layer thus formed is subjected to a surface-planarization treatment according to the CMP technique to thus form a Cu-interconnection film. In this respect, it is sufficient that the porous silica film used as such an interlayer dielectric film is one according to the present invention, but the latter has particularly preferably a specific inductive capacity and a strength level falling within the desired ranges, respectively. To obtain such a porous silica film, it is sufficient that the precursor composition is one described above and, in particular, the precursor composition is preferably one including a desired amount of a quaternary ammonium compound and a desired amount of a hydrophobic substance.

In addition, after the formation of the interlayer dielectric film, a dielectric film-protecting layer may be formed on this interlayer dielectric film in a thickness ranging from about 50 to about 200 nm. In this case, the interlayer dielectric film may be formed from, for instance, an organic Low-k material (such as SiLK mainly comprising a poly(aryl ether) and a protective layer may be formed on the interlayer dielectric film using the porous silica according to the present invention. Alternatively, the both interlayer dielectric film and dielectric film-protecting layer may be formed from the porous silica according to the present invention. In this respect, however, the physical properties of the porous silica film serving as the interlayer dielectric film and the conditions for forming the dielectric film are preferably different from the physical properties of the porous silica film used as the dielectric film-protecting layer and the conditions for forming the protecting layer. The porous silica film used as the dielectric film-protecting layer preferably has a specific inductive capacity and a strength level falling within the desired ranges, respectively. To obtain such a porous silica film, it is sufficient that the precursor composition is one described above and, in particular, the precursor composition is preferably one including a desired amount of a quaternary ammonium compound and a desired amount of a hydrophobic substance.

In addition, the porous silica film according to the present invention can also be used as a low refractive index film for the optical thin film structure used in an apparatus for displaying an image. An example of such an optical thin film structure is one comprising a glass substrate, provided thereon with a low refractive index film, an intermediate adhesive layer, a transparent conductive film, and a light-emitting element or layer such as an organic EL element, an inorganic EL element or PL (photoluminescence) element, which are formed on the glass substrate in this order.

An indium-tin oxide (ITO film) is used as a raw material for forming the transparent conductive film and the electrode layers of the structure of a light-emitting element are formed using this material. The low refractive index film is formed from a porous silica material subjected to a hydrophobization treatment. The laminated structure comprising the transparent conductive film and the low refractive index film would permit the extraction or leading out of the emitted light rays at a desired high efficiency. Materials for forming the intermediate adhesive layer used for enhancing the adhesive strength between the transparent conductive film and the low refractive index film are, for instance, transparent dielectric films such as $SiO_2$ films.

When producing an optical thin film structure according to the present invention, a low refractive index film or a porous silica film is first formed on a transparent dielectric substrate such as a glass substrate according to either one of the foregoing film-forming techniques. For instance, the precursor composition may be coated on a glass substrate according to the spin coating method to thus form a low refractive index film and then the resulting coated film is fired at a predetermined temperature for a predetermined time period as has been described above. After cleansing the fired film, a thermally oxidized film of silicon is formed on the low refractive index film according to the vapor deposition or evaporation techniques such as the electron beam evaporation technique or the resistance heating technique, or the chemical vapor deposition technique (CVD technique), or a transparent dielectric film consisting of an $SiO_2$ film is formed on the low refractive index film according to the RF sputtering technique, to thus form an intermediate adhesive layer. At this stage, the thickness of the intermediate adhesive layer can be controlled such that it may fall within the range of from 5 to 300 nm and at this stage, the flatness of the resulting film surface can be controlled to not higher than 50 nm as expressed in terms of the central line average roughness. If the resulting film satisfies such numerical conditions, the film never undergoes any refraction and/or reflection of the visible light rays to be extracted and it can thus prevent the generation of any uneven luminance.

Thereafter, a film of indium-tin oxide (ITO film) is formed on the intermediate adhesive layer at room temperature according to the DC sputtering technique. Such an ITO film is likewise available from ULVAC INC. under the name of "Super ITO Film A". Moreover, the materials for forming the transparent conductive film is not limited to ITO films and examples thereof likewise can include transparent conductive films having a transmittance of not less than 80% with respect to the visible light such as those prepared from tin oxide ($SnO_2$), indium oxide ($In_2O_3$), zinc oxide (ZnO), cadmium oxide (CdO), and combination thereof, for instance, cadmium oxide-tin oxide ($Cd_2SnO_4$), cadmium oxide-zinc oxide (CZT) and indium oxide-zinc oxide (IZO).

The optical thin film structure prepared by the method described above has a low refractive index and therefore, it is quite suitable for use as a layer which constitutes the window material for display.

Moreover, the porous silica film of the present invention can likewise be used as the liquid crystal orientation-controlling film incorporated into a liquid crystal display. For instance, the porous silica films of the present invention are, in serial order, formed on the surface of a pair of glass substrate as a transparent conductive film and a liquid crystal orientation-controlling film. In this respect, the paired glass substrates are arranged in a relation symmetrical with each another through a liquid crystal layer sandwiched between these glass substrates in such a manner that the two orientation-controlling films face each other and that the distance between the paired substrates is set at 50 μm. In this connection, one of the transparent conductive films serves as a positive electrode, while the other thereof serves as a negative electrode and these transparent conductive films thus constitute a pair of electrodes. The glass substrates which are arranged in a symmetrical relation so that they face one another, are sandwiched between a pair of polarizing plates, whose planes of polarization are perpendicular to one another, on the outer planes of the paired substrates to thus complete a liquid crystal display.

The present invention will hereunder be described in more detail with reference to the following Examples, but the present invention is not limited to these specific Examples at all.

EXAMPLE 1

To a PTFE bottle, there were added 1 mole of tetraethoxysilane, 20 moles of 2-propanol, 20 moles of water, and 0.20 moles of tetrapropyl-ammonium bromide, followed by the introduction of a stirring rod in the bottle, the hermetical sealing of the same, and the placing of the bottle on a stirrer to thus stir the contents of the bottle at room temperature over 24 hours. Thereafter, the contents of the bottle were stirred at 55° C. for 4 hours to thus give a porous silica precursor composition.

The resulting porous silica precursor composition was found to be a uniform mixture, did not cause any separation and the formation of any precipitate even when allowing it to stand at room temperature over several hours and it was found to be neutral.

EXAMPLE 2

The porous silica precursor composition prepared in Example 1 was applied onto the surface of a silicon substrate according to the spin coating technique at a rotational frequency of 1,000 rpm. Then the substrate provided thereon with the applied layer of the composition was introduced into a firing oven and fired at 400° C. for 15 minutes in the atmosphere. The thickness of the resulting film was found to be 178 nm.

This film was inspected for the specific inductive capacity using a mercury-probe type CV measuring device (an impedance analyzer) and the specific inductive capacity thereof was found to be 2.40. In addition, the film was further inspected for the refractive index using an ellipsometer and the refractive index thereof was found to be 1.246 and the film was further inspected for the Young's modulus and the hardness using a device available from MTS Systems Co., Ltd. under the trade name of NANO INTENDER and as a result, the Young's modulus and hardness of the film were found to be 6 GPa and 0.5 GPa, respectively.

COMPARATIVE EXAMPLE 1

To a PTFE bottle, there were added 1 mole of tetraethoxysilane, 20 moles of 2-propanol and 20 moles of water, followed by the introduction of a stirring rod in the bottle, the hermetical sealing of the same, and the placing of the bottle on a stirrer to thus stir the contents of the bottle at room temperature over 24 hours. Thereafter, the contents of the bottle were stirred at 55° C. for 4 hours to thus give a porous silica precursor composition. The resulting porous silica precursor composition was found to be a uniform mixture, and did not cause any separation and the formation of any precipitate even when allowing it to stand at room temperature over a several hours. The porous silica precursor composition thus prepared was applied onto the surface of a silicon substrate according to the spin coating technique at a rotational frequency of 1,000 rpm, but any film did not remain on the silicon substrate. The reason why any film was not formed on the substrate in this case would be assumed to be as follows: The composition prepared in this Comparative Example 1 did not include any quaternary ammonium compound which was incorporated into the foregoing porous silica precursor composition of the present invention and which could serve as a catalyst.

COMPARATIVE EXAMPLE 2

The same procedures used in Example 1 were repeated under the same conditions used in the latter except for adding 0.01 mole of tetrapropyl-ammonium bromide to thus form a porous silica precursor composition. The resulting porous silica precursor composition was found to be a uniform mixture, and did not cause any separation and the formation of any precipitate even when allowing it to stand at room temperature over a several hours. The porous silica precursor composition thus prepared was applied onto the surface of a silicon substrate according to the spin coating technique at a rotational frequency of 1,000 rpm, but any film did not remain on the silicon substrate.

COMPARATIVE EXAMPLE 3

The same procedures used in Example 1 were repeated under the same conditions used in the latter except for adding 0.5 moles of tetrapropyl-ammonium bromide to thus form a porous silica precursor composition. The resulting porous silica precursor composition was found to be a uniform mixture, and did not cause any separation and the formation of any precipitate even when allowing it to stand at room temperature over a several hours. The porous silica precursor composition thus prepared was applied onto the surface of a silicon substrate according to the spin coating technique at a rotational frequency of 1,000 rpm, but the surface of the resulting film was found to be rough and it also had cloudy appearance. These results clearly indicate that if the quaternary ammonium compound was added in excess, the shape of the micelles formed by this compound would be changed and more specifically, it would undergo a structural change from a rod-like micelle to a lamellar micelle, and accordingly, the composition could not form desired pores through the decomposition and escapement of this component when the layer was subjected to a firing step. Incidentally, if the quaternary ammonium compound is added in excess, a problem arises such that the solution or composition becomes unstable since the compound likewise shows a catalytic action and that it may undergo gelation within a short period of time.

EXAMPLE 3

The same procedures used in Example 1 were repeated under the same conditions used in the latter except that 0.10 mole of hexadecyl-trimethyl-ammonium chloride was substituted for 0.02 moles of the tetrapropyl-ammonium bromide used in Example 1 and that 0.15 moles of hexamethyl-disiloxane was added as a hydrophobic substance, to thus form a porous silica precursor composition.

The resulting porous silica precursor composition was found to be a uniform mixture, did not cause any separation and the formation of any precipitate even when allowing it to stand at room temperature over several hours. Moreover, this porous silica precursor composition was found to be neutral.

EXAMPLE 4

The hydrophobic porous silica precursor composition prepared in Example 3 was applied onto the surface of a silicon substrate according to the spin coating technique at a rotational frequency of 1,000 rpm. Then the substrate provided thereon with the coated layer of the composition was introduced into a firing oven and then fired at a temperature of 400° C. for 60 minutes in an oxygen gas atmosphere. Thereafter, the fired product was subjected to a hydrophobization treatment in an atmosphere obtained by bubbling 1,1,1,3,3,3-hexamethyl-disilazane as a hydrophobic substance at a pressure of $1 \times 10^3$ Pa according to the bubbling technique which made use of nitrogen gas as a carrier gas, while maintaining the temperature in the firing oven at 400° C. The resulting porous film was found to have a thickness of 219 nm.

This film was inspected for the specific inductive capacity using an impedance analyzer and the specific inductive capacity thereof was found to be 2.40. In addition, the film was further inspected for the refractive index using an ellipsometer and the refractive index thereof was found to be 1.21 and the film was further inspected for the Young's modulus and the hardness using a device available from MTS Systems Co., Ltd. under the trade name of NANO INTENDER and as a result, the Young's modulus and hardness of the film were found to be 7 GPa and 0.65 GPa, respectively.

EXAMPLE 5

The hydrophobic porous silica precursor composition prepared in Example 3 was applied onto the surface of a silicon substrate according to the spin coating technique at a rotational frequency of 500 rpm. Then the substrate provided thereon with the coated layer of the composition was introduced into a firing oven and then fired at a temperature of 450° C. for 30 minutes in an oxygen gas atmosphere. Thereafter, the fired product was subjected to a hydrophobization treatment in an atmosphere obtained by bubbling 1,1,1,3,3,3-hexamethyl-disilazane as a hydrophobic substance according to the bubbling technique which made use of nitrogen gas as a carrier gas, while maintaining the temperature in the firing oven at 450° C. The resulting porous film was found to have a thickness of 416 nm.

This film was inspected for the specific inductive capacity using an impedance analyzer and the specific inductive capacity thereof was found to be 2.03. In addition, the film was further inspected for the refractive index using an ellipsometer and the refractive index thereof was found to be 1.20 and the film was further inspected for the Young's modulus and the hardness using a device available from MTS Systems Co., Ltd. under the trade name of NANO INTENDER and as a result, the Young's modulus and hardness of the film were found to be 4 GPa and 0.4 GPa, respectively.

EXAMPLE 6

The same procedures used in Example 3 were repeated under the same conditions used in the latter except that 0.10 mole of tetrapropyl-ammonium bromide and 0.10 mole of hexadecyl-trimethyl-ammonium chloride were substituted for 0.10 mole of the hexadecyl-trimethyl-ammonium chloride used in Example 3, to thus form a porous silica precursor composition.

The resulting porous silica precursor composition was found to be a uniform mixture, did not cause any separation and the formation of any precipitate even when allowing it to stand at room temperature over several hours. Moreover, this porous silica precursor composition was found to be neutral.

EXAMPLE 7

The porous silica precursor composition prepared in Example 6 was applied onto the surface of a silicon substrate according to the spin coating technique at a rotational frequency of 500 rpm. Then the substrate provided thereon with the coated layer of the composition was introduced into a firing oven and then fired at a temperature of 450° C. for 30 minutes in an oxygen gas atmosphere. Thereafter, the fired product was subjected to a hydrophobization treatment in an atmosphere obtained by bubbling 1,1,1,3,3,3-hexamethyl-disilazane as a hydrophobic substance according to the bubbling technique which made use of nitrogen gas as a carrier gas, while maintaining the temperature in the firing oven at 450° C. The resulting porous film was found to have a thickness of 401 nm.

This film was inspected for the specific inductive capacity using an impedance analyzer and the specific inductive capacity thereof was found to be 2.59. In addition, the film was further inspected for the refractive index using an ellipsometer and the refractive index thereof was found to be 1.216 and the film was further inspected for the Young's modulus and the hardness using a device available from MTS Systems Co., Ltd. under the trade name of NANO INTENDER and as a result, the Young's modulus and hardness of the film were found to be 7.93 GPa and 0.62 GPa, respectively.

EXAMPLE 8

The same procedures used in Example 6 were repeated under the same conditions used in the latter except that 0.15 moles of tetrapropyl-ammonium bromide and 0.10 mole of hexadecyl-trimethyl-ammonium chloride were substituted for 0.10 mole of the tetrapropyl-ammonium bromide and 0.10 mole of hexadecyl-trimethyl-ammonium chloride used in Example 6, to thus form a porous silica precursor composition.

The resulting porous silica precursor composition was found to be a uniform mixture and did not cause any separation and the formation of any precipitate even when allowing it to stand at room temperature over several hours. Moreover, this porous silica precursor composition was found to be neutral.

EXAMPLE 9

The porous silica precursor composition prepared in Example 8 was applied onto the surface of a silicon substrate according to the spin coating technique at a rotational frequency of 500 rpm. Then the substrate provided thereon with the coated layer of the composition was introduced into a firing oven and then fired at a temperature of 450° C. for 30 minutes in an oxygen gas atmosphere. Thereafter, the fired product was subjected to a hydrophobization treatment in an atmosphere obtained by bubbling 1,1,1,3,3,3-hexamethyl-disilazane as a hydrophobic substance according to the bubbling technique which made use of nitrogen gas as a carrier gas, while maintaining the temperature in the firing oven at 450° C. The resulting porous film was found to have a thickness of 415 nm.

This film was inspected for the specific inductive capacity using an impedance analyzer and the specific inductive capacity thereof was found to be 2.36. In addition, the film was further inspected for the refractive index using an ellipsometer and the refractive index thereof was found to be 1.227 and the film was further inspected for the Young's modulus and the hardness using a device available from MTS Systems Co., Ltd. under the trade name of NANO INTENDER and as a result, the Young's modulus and hardness of the film were found to be 6.62 GPa and 0.49 GPa, respectively. The film prepared in this Example was found to be useful as a dielectric film.

EXAMPLE 10

The same procedures used in Example 1 were repeated under the same conditions used therein except for adding 0.05 moles of tetrapropyl-ammonium bromide to thus form a porous silica precursor composition.

The resulting porous silica precursor composition was found to be a uniform mixture and did not cause any separation and the formation of any precipitate even when allowing it to stand at room temperature over several hours. Moreover, this porous silica precursor composition was found to be neutral. The resulting porous silica precursor composition was applied onto the surface of a silicon substrate according to the spin coating technique at a rotational frequency of 1,000 rpm. Then the substrate provided thereon with the coated layer of the composition was introduced into a firing oven and then fired at a temperature of 400° C. for 15 minutes in the atmosphere. The resulting film was found to have a thickness of 90 nm. This film was inspected for the specific inductive capacity using an impedance analyzer and the specific inductive capacity thereof was found to be 2.3. In addition, the film was further inspected for the refractive index using an ellipsometer and the refractive index thereof was found to be 1.23. Moreover, the film was inspected for the Young's modulus and the hardness using a device available from MTS Systems Co., Ltd. under the trade name of NANO INTENDER and as a result, the Young's modulus and hardness of the film were found to be 8.9 GPa and 0.9 GPa, respectively. The film prepared in this Example was found to be useful as a dielectric film-protecting layer.

EXAMPLE 11

The same procedures used in Example 1 were repeated under the same conditions used therein except for adding 0.4 moles of tetrapropyl-ammonium bromide to thus form a porous silica precursor composition.

The resulting porous silica precursor composition was found to be a uniform mixture and did not cause any separation and the formation of any precipitate even when allowing it to stand at room temperature over several hours. Moreover, this porous silica precursor composition was found to be neutral. The resulting porous silica precursor composition was applied onto the surface of a silicon substrate according to the spin coating technique at a rotational frequency of 1,000 rpm. Then the substrate provided thereon with the coated layer of the composition was introduced into a firing oven and then fired at a temperature of 400° C. for 15 minutes in the atmosphere. The resulting film was found to have a thickness of 150 nm. This film was inspected for the specific inductive capacity using an impedance analyzer and the specific inductive capacity thereof was found to be 2.1. In addition, the film was further inspected for the refractive index using an ellipsometer and the refractive index thereof was found to be 1.15. Moreover, the film was inspected for the Young's modulus and the hardness using a device available from MTS Systems Co., Ltd. under the trade name of NANO INTENDER and as a result, the Young's modulus and hardness of the film were found to be 3.0 GPa and 0.3 GPa, respectively. The film obtained in this Example was found to be useful as an optical film.

COMPARATIVE EXAMPLE 4

The same procedures used in Example 4 were repeated under the same conditions used therein except that the firing step was carried out in a nitrogen gas atmosphere to thus give a porous silica film. The physical properties of the resulting film were not preferred or acceptable as compared with those observed for the films prepared in the foregoing Examples. More specifically, the film obtained in this Comparative Example was found to have a high specific inductive capacity, a low refractive index, and high mechanical strength.

The results obtained in the foregoing Examples and Comparative Examples clearly indicate that the porous silica precursor composition according to the present invention and the porous silica prepared using the precursor composition would permit the preparation of a film having a low specific inductive capacity, a low refractive index and high mechanical strength.

INDUSTRIAL APPLICABILITY

The use of the porous silica precursor composition according to the present invention permits the formation of a porous silica film having a low specific inductive capacity, a low refractive index and high mechanical strength. Such a porous silica film can be used as a dielectric layer (and a dielectric film-protecting layer) for use in a semiconductor element, as a dielectric layer for use in an apparatus for displaying an image, and as a liquid crystal orientation-controlling film for use in a liquid crystal display. Accordingly, the present invention can be used in the fields of the semiconductor-production and the display system-manufacture.

What is claimed is:

1. A porous silica precursor composition consisting of an organic silane represented by the following chemical formula 1: $R^1{}_m(R^2-O)_{4-m}Si$ (in the formula, $R^1$ and $R^2$ may be the same or different and each represent an alkyl group, and m is an integer ranging from 0 to 3); water; an alcohol; a quaternary ammonium compound represented by the following chemical formula 2: $R^3N(R^4)_3X$ (in the formula, $R^3$ and $R^4$ may be the same or different and each represent an alkyl group and X represents a halogen atom); and a hydrophobic substance consisting of disilazane compounds carrying an alkyl group and siloxane compounds carrying an alkyl group, wherein the composition is free of any acid or alkali serving as a catalyst.

2. The porous silica precursor composition as set forth in claim 1, wherein the alkyl group is one having not more than 7 carbon atoms.

3. The porous silica precursor composition as set forth in claim 1, wherein the halogen atom appearing in the chemical formula 2 is a chlorine or bromine atom.

4. The porous silica precursor composition as set forth in claim 1, wherein the molar ratio of the organic silane to the quaternary ammonium compound ranges from 1:0.05 to 1:0.40.

5. The porous silica precursor composition as set forth in claim 1, wherein the molar ratio of the organic silane to the water ranges from 1:1 to 1:30, and the molar ratio of the organic silane to the alcohol ranges from 1:10 to 1:300.

6. A method for preparing a porous silica precursor composition comprising the step of blending a porous silica precursor composition consisting of an organic silane represented by the following chemical formula 1: $R^1{}_m(R^2-O)_{4-m}$ Si (in the formula, $R^1$ and $R^2$ may be the same or different and each represent an alkyl group, and m is an integer ranging from 0 to 3); water; an alcohol; a quaternary ammonium compound represented by the following chemical formula 2: $R^3N(R^4)_3X$ (in the formula, $R^3$ and $R^4$ may be the same or different and each represent an alkyl group and X represents a halogen atom); and a hydrophobic substance consisting of disilazane compounds carrying an alkyl group and siloxane compounds carrying an alkyl group, wherein the composition is free of any acid or alkali serving as a catalyst.

7. The method for preparing a porous silica precursor composition as set forth in claim 6, wherein after the completion of the blending step, the resulting blend is heated to a temperature ranging from 40 to 70° C.

8. A porous silica film characterized in that it is formed using the porous silica precursor composition as set forth in claim 1.

9. A method for forming a porous silica film comprising the steps of applying, onto the surface of a substrate, the porous silica precursor composition as set forth in claim 1; and firing the substrate provided thereon with the precursor composition at a temperature ranging from 250 to 500° C.

10. The method for forming a porous silica film as set forth in claim 9, wherein the firing step is carried out in an oxygen-containing atmosphere.

11. The method for forming a porous silica film as set forth in claim 9, wherein after the completion of the firing step, the fired product is subjected to a hydrophobization treatment.

12. The method for forming a porous silica film as set forth in claim 11, wherein the hydrophobization treatment is carried out in a hydrophobic substance-containing atmosphere maintained at a temperature ranging from 70 to 500° C.

13. A method for forming a porous silica film comprising the steps of applying, onto the surface of a substrate, the porous silica precursor composition as set forth in claim 1; and firing the substrate provided thereon with the precursor composition at a temperature ranging from 350 to 500° C., in an oxygen atom-containing atmosphere.

14. A method for forming a porous silica film comprising the steps of applying, onto the surface of a substrate, the porous silica precursor composition as set forth in claim 1; and firing the substrate provided thereon with the precursor composition at a temperature ranging from 350 to 500° C., in an oxygen atom-containing atmosphere; and subjecting the fired product to a hydrophobization treatment after the completion of the firing step.

15. A semiconductor element which includes a dual damascene structure composed of a film of an organic silicon atom-containing compound or a porous silicon oxide film as a first dielectric film and an interlayer dielectric film formed, in this order, on a substrate provided thereon with an interconnection layer, and further a Cu-interconnection film embedded in interconnection grooves, wherein the interlayer dielectric film consists of the porous silica film as set forth in claim 8.

16. A semiconductor element which includes a dual damascene structure composed of a film of an organic silicon atom-containing compound or a porous silicon oxide film as a first dielectric film, an interlayer dielectric film and a dielectric film-protecting layer formed, in this order, on a substrate provided thereon with an interconnection layer, and further a Cu-interconnection film embedded in interconnection grooves, wherein the dielectric film-protecting layer consists of the porous silica film as set forth in claim 8.

17. An apparatus for displaying an image which has an optical thin film for a display window, the optical thin film including a transparent conductive film and a film having a low refractive index, laminated together through an intermediate adhesive layer, wherein the film having a low refractive index consists of the porous silica film as set forth in claim 8.

18. A liquid crystal display which at least comprises a pair of substrates; a transparent conductive film and a film for controlling the orientation of liquid crystals formed, in this order, on each of opposed planes of the paired substrates; and a liquid crystal layer obtained by sealing and enclosing liquid crystals between the liquid crystal orientation-controlling films, wherein the liquid crystal orientation controlling film consists of the porous silica film as set forth in claim 8.

* * * * *